United States Patent [19]

Frame et al.

[11] 4,412,209

[45] Oct. 25, 1983

[54] RC ARRAY

[75] Inventors: Norman J. Frame, Whitefish Bay; James P. Walber, Cedar Grove; Jan M. Janick, Brookfield, all of Wis.

[73] Assignee: W. H. Brady Co., Milwaukee, Wis.

[21] Appl. No.: 323,281

[22] Filed: Nov. 20, 1981

[51] Int. Cl.³ .............................................. G06F 3/02
[52] U.S. Cl. ............................ 340/365 C; 340/365 S; 340/365 A; 340/365 R; 179/90 K; 178/17 C; 200/52 R
[58] Field of Search ........... 340/365 C, 365 S, 365 A, 340/365 R, 711; 364/709, 712; 400/479.1; 200/DIG. 1, 52 R; 178/17 C, 18; 179/90 K

[56] References Cited

U.S. PATENT DOCUMENTS

| | | | |
|---|---|---|---|
| T904,008 | 11/1972 | Crouse | 178/17 C |
| 3,750,113 | 7/1973 | Cencel | 340/365 C |
| 3,778,816 | 12/1973 | Cuccio | 340/365 S |
| 4,015,254 | 3/1977 | Strandt | 340/365 R |

Primary Examiner—Donnie L. Crosland

[57] ABSTRACT

A switch assembly with a different combination of resistance and capacitance associated with each of a plurality of switches and with as few as two leads connecting the plurality of switches to external circuitry. The external circuitry detects switch activation by sensing combined resistance and capacitance across the switch leads.

12 Claims, 4 Drawing Figures

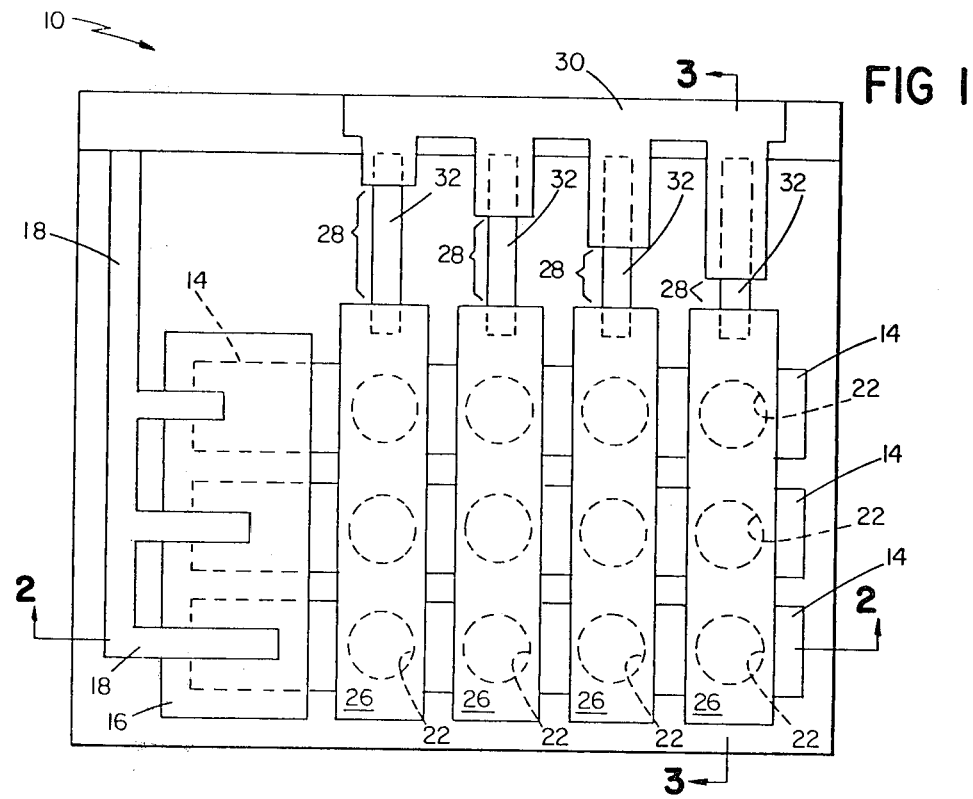
FIG 1
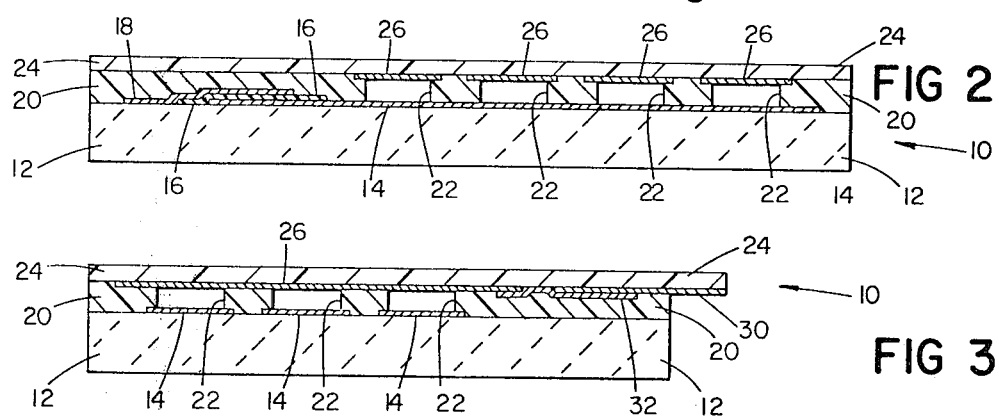
FIG 2
FIG 3
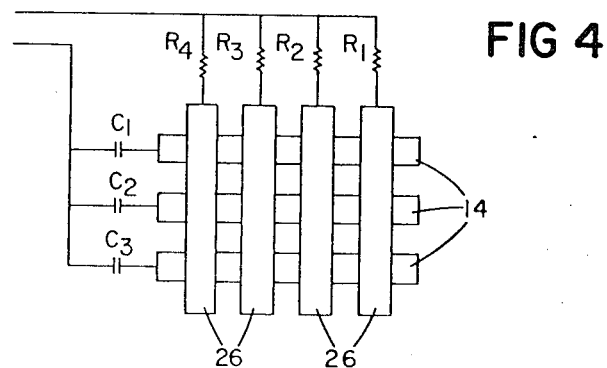
FIG 4

RC ARRAY

FIELD OF THE INVENTION

This invention relates to capacitance-type switches.

BACKGROUND OF THE INVENTION

It is often desirable to reduce the number of electrical leads necessary for connecting an assembly of switches to external circuitry.

One known technique is to use an XY arrangement wherein one lead is provided for each column and another for each row of an array of switches (e.g., 7 leads instead of 12 for a 3×4 array).

Also known in the switch art is to provide a movable element that causes a change in capacitance, which change is then sensed by external circuitry.

SUMMARY OF THE INVENTION

We have discovered that a reduction in the number of electrical leads can be achieved by associating with each switch location a different combination of resistance and capacitance, which combination is detected by external detection circuitry connected to the switch assembly by as few as two leads.

In preferred embodiments, the switches are arranged in an XY array with X and Y conductors; the X conductors are connected to capacitors of different capacitance value and the Y conductors to resistors of different resistance value; a flexible membrane switch construction is used; the capacitors are formed as a sandwich of deposited conductive layers and a dielectric layer with the difference in capacitance value provided by different size areas for the sandwiches; the resistors are formed by deposited pads of resistive material spanning a gap between conductive layers, with the difference in resistance value provided by difference in the gap size; vacuum deposition is used; and preferred materials are used.

The invention requires a smaller number of different capacitance values than if capacitors alone were used. Manufacturing costs are reduced by the use of small quantities of metal for the conductors and contacts and by the use of non-precious metals. Other advantages will be apparent from the following description of a presently preferred embodiment of the invention.

PREFERRED EMBODIMENT

I turn now to a description of the presently preferred embodiment of the invention, after first briefly describing the drawings.

DRAWINGS

FIG. 1 is a plan view of said preferred embodiment.

FIG. 2 is an enlarged cross-sectional view taken at 2—2 of FIG. 1, with the thicknesses of various layers greatly exaggerated and not to scale.

FIG. 3 is an enlarged cross-sectional view taken at 3—3 of FIG. 1, with the thickness of various layers greatly exaggerated and not to scale.

FIG. 4 is a schematic diagram of the electrical elements of said embodiment.

DESCRIPTION

Turning now to the drawings, there is shown a membrane switch 10 (i.e., a switch in which a flexible layer is flexed in order to produce a signal output). Glass substrate 12 (FIG. 2) has vacuum deposited on its upper surface, through a suitable mask, three horizontal row conductors 14 (2000 Angstrom thick aluminum). At the left edge of the glass substrate there are formed three thin-film capacitors $C_1$–$C_3$ of different capacitance values. Pad 16 of $Ta_2O_5$ dielectric is vacuum deposited over the left ends of row conductors 14. The pad is, in turn, covered by a vacuum deposited layer 18 of aluminum, which extends (FIG. 1) from the pad along the left edge of the switch to the upper edge where a connection can be made to external circuitry. The areas of aluminum overlapping the $Ta_2O_5$ and row conductors are each a different size to provide the three different capacitance values $C_1$–$C_3$ (2, 12, and 60 nanofarads).

On top of glass substrate 12 is a top layer 24 of 5-mil thick transparent polyester film on which has been vacuum deposited, through a suitable mask, four column conductors 26 (4000 Angstrom thick copper). At the upper edge of the switch, there are formed four thin-film resistances $R_1$–$R_4$. Varying size gaps 28 between column conductors 26 and edge contact 30 (also 4000 Angstrom thick copper) are filled with pads 32 of vacuum deposited nichrome resistive material, thereby providing the desired four resistance values $R_1$–$R_4$ (1K, 2K, 3K, and 4K ohms). Edge contact 30 provides the second connection to external circuitry.

Over the column conductors and other vacuum deposited layers on top layer 24 there is deposited, through a mask, spacer layer 20 ($\frac{1}{2}$-mil thick pressure-sensitive acrylic adhesive), which has generally circular openings 22 aligned with the twelve switch locations defined by the areas where row conductors 14 cross column conductors 26. Switch 10 is finally assembled by applying top layer 24 with its adhesive spacer layer 20 to glass substrate 12.

In operation, a selected switch is activated by depression of top layer 24 at the desired switch location. That action causes a column conductor 26 on the undersurface of layer 24 to engage a row conductor 14 through an opening 22 in the spacer layer. External detection circuitry then senses the value of the RC combination produced and generates a signal identifying the switch location.

OTHER EMBODIMENTS

Other embodiments of the invention are within the following claims. For example, in situations where the number of desired switch locations demands an excessively large number of different capacitance values (such as would place excessive demands on manufacturing tolerances in laying down the capacitors), it is possible to organize the switch array into subarrays. Each subarray employs all of the available capacitance values, each row conductor of the subarray being connected to a different capacitance. All the capacitors of one subarray are connected to the detection circuitry by a common lead, and there is a separate such lead for each subarray. The same arrangement can be provided for the resistors, but as a greater number of resistance values can generally be provided than capacitance values, it may often be possible to provide a different resistance value for each column conductor. For a 48 by 48 matrix of switches, such an embodiment might have 6 subarrays, each with the same eight different capacitance values, and 48 different resistance values, bringing to seven the number of leads required for the switch. For the case of a matrix for a CRT screen having a 512 by 256 pixel array, which translates to 131,072 individual locations, this subarray arrangement would require only about 48 separate leads.

What is claimed is:

1. An assembly of switches, comprising
a plurality of switch elements each including first and second electrical contacts,
a plurality of capacitors each having a different capacitance value and each having first and second electrical connections,
a plurality of resistors each having a different resistance value and each having first and second electrical connections,
a plurality of first conductors forming an electrical connection between said first capacitor connections and said first switch contacts,
a plurality of second conductors forming an electrical connection between said first resistor connections and said second switch contacts,
a first electrical lead connecting all of said second capacitor connections, for supplying a first electrical connection to external detection circuitry, and
a second electrical lead connecting all of said second resistor connections, for supplying a second electrical connection to external detection circuitry,
whereby said external detection circuitry is connected to a different combination of resistance and capacitance for each of said plurality of switch elements, thereby allowing said circuitry to distinguish which of said switch elements has been activated.

2. The switch assembly of claim 1 wherein said switch elements are arranged in an array, said first conductors form the rows of the array, and said second conductors form the columns of the array.

3. The switch assembly of claim 2 wherein
said switch assembly comprises a flexible membrane switch comprising a flexible membrane, a substrate, and a spacer layer positioned between said membrane and substrate,
said first contacts and first conductors are conductive elements adhered to one of said membrane and substrate,
said second contacts and second conductors are conductive elements adhered to the other of said membrane and substrate, and
each pair of said first and second contacts are aligned with an opening in said spacer layer to define a said switch element.

4. The switch assembly of claim 3 wherein
said first contacts and conductors comprise generally parallel first conductive strips adhered to either said membrane or substrate,
said second contacts and conductors comprise generally parallel second conductive strips adhered to the other of said membrane or substrate, and
said first and second conductive strips are oriented generally perpendicular to one another in the form of a grid wherein the regions at which the conductive strips cross are the locations of said switch elements.

5. The switch assembly of claim 4 wherein said conductive strips are normally separated from one another such that said switch elements are normally open.

6. The switch assembly of claim 3 wherein
said capacitors comprise a layer of dielectric material sandwiched between first and second layers of conductive material,
all three of said layers are adhered to either said membrane or said substrate,
each of said first layers of conductive material is connected to one of said first conductors, and
each of said second layers of conductive material is connected to said first electrical lead.

7. The switch assembly of claim 3 or 6 wherein
said resistors comprise a layer of resistive material spanning across a gap between transversely spaced apart third and fourth layers of conductive material,
all three of said layers are adhered to either said membrane or said substrate,
each of said third layers of conductive material is connected to one of said second conductors, and
each of said fourth layers of conductive material is connected to said second electrical lead.

8. The switch assembly of claim 7 wherein the areas of said dielectric and first and second layer sandwich is different for each of said capacitors, thereby providing said different capacitance values.

9. The switch assembly of claim 8 wherein the span bridged by said resistive material is different for each of said resistors, thereby providing said different resistance values.

10. The switch assembly of claim 9 wherein
said first contacts and conductors comprise rows deposited on said substrate,
said second contacts and conductors comprise columns deposited on said membrane,
said first electrical lead comprises a layer deposited on said substrate,
said second electrical lead comprises a layer deposited on said membrane,
said first layers of conductive material are integral extensions of said first conductors,
said second layers of conductive material are integral extensions of said first electrical lead,
said third layers of conductive material are integral extensions of said second conductors, and
said fourth layers of conductive material are integral extensions of said second electrical lead.

11. The switch assembly of claim 10 wherein said contacts, conductors, dielectric material, resistive material, and conductive material are vacuum deposited onto said membrane and substrate.

12. The switch assembly of claim 11 wherein
said substrate is glass,
said membrane is polyester,
said spacer layer is pressure-sensitive acrylic adhesive deposited on said membrane prior to assembly of said membrane onto said glass,
said first electrical lead is aluminum deposited on said glass,
said second electrical lead is copper deposited on said polyester,
said first contacts and conductors are rows of Al deposited on said glass,
said second contacts and conductors are columns of copper deposited on said polyester,
said dielectric is $Ta_2O_5$, and
said resistive material is nichrome.

* * * * *